United States Patent
Hurwitz

(10) Patent No.: US 11,164,892 B2
(45) Date of Patent: Nov. 2, 2021

(54) SEMICONDUCTOR-ON-INSULATOR (SOI) DEVICE WITH REDUCED PARASITIC CAPACITANCE

(71) Applicant: Newport Fab, LLC, Newport Beach, CA (US)

(72) Inventor: Paul D. Hurwitz, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 22 days.

(21) Appl. No.: 16/459,339

(22) Filed: Jul. 1, 2019

(65) Prior Publication Data

US 2021/0005630 A1    Jan. 7, 2021

(51) Int. Cl.
  *H01L 29/06*    (2006.01)
  *H01L 27/12*    (2006.01)
  *H01L 21/762*   (2006.01)

(52) U.S. Cl.
  CPC .... *H01L 27/1203* (2013.01); *H01L 21/76243* (2013.01); *H01L 21/76289* (2013.01); *H01L 29/0649* (2013.01)

(58) Field of Classification Search
  CPC ............. H01L 27/1203; H01L 29/0649; H01L 21/76243; H01L 21/76289
  USPC ........................................................ 257/347
  See application file for complete search history.

(56) References Cited

U.S. PATENT DOCUMENTS

| | | | |
|---|---|---|---|
| 2008/0203484 A1* | 8/2008 | Hofmann | H01L 21/76267 257/369 |
| 2012/0306049 A1* | 12/2012 | Booth, Jr. | H01L 29/0649 257/532 |
| 2018/0090491 A1* | 3/2018 | Huang | H01L 21/76232 |
| 2018/0175180 A1* | 6/2018 | Jain | H01L 29/735 |
| 2018/0226292 A1* | 8/2018 | Pekarik | H01L 29/7317 |
| 2019/0103282 A1* | 4/2019 | Ge | H01L 29/42392 |
| 2019/0276739 A1* | 9/2019 | Liu | C09K 13/00 |

OTHER PUBLICATIONS

N. Pham et al "A micromachining post-process module for RF silicon technology," IEDM, pp. 481-484, 2000.

* cited by examiner

*Primary Examiner* — Long K Tran
(74) *Attorney, Agent, or Firm* — Farjami & Farjami LLP

(57) ABSTRACT

A semiconductor-on-insulator (SOI) device including a handle wafer, a buried oxide (BOX), and a top device layer is provided. A plurality of elongated trenches are formed in the handle wafer. Air gaps are formed in the elongated trenches by pinching off each of the elongated trenches. In one approach, prior to the pinching off, a plurality of lateral openings are formed contiguous with the elongated trenches and adjacent to the BOX. The elongated trenches and/or the lateral openings reduce parasitic capacitance between the handle wafer and the top device layer. In another approach, sidewalls of the elongated trenches are implant-damaged so as to further reduce the parasitic capacitance between the handle wafer and the top device layer.

18 Claims, 10 Drawing Sheets

SEMICONDUCTOR-ON-INSULATOR (SOI) DEVICE WITH REDUCED PARASITIC CAPACITANCE

BACKGROUND

Semiconductor-on-insulator (SOI) devices are commonly employed to realize radio frequency (RF) designs where high noise isolation and low signal loss are required. These SOI devices use a buried oxide (BOX) to isolate RF circuit components, such as transistors and/or passive components, in a top device layer. However, a handle wafer functioning as a substrate under the BOX results in some signal loss.

In one approach, a high resistivity silicon is used for the handle wafer in order to improve isolation and reduce substrate signal loss. However, the relatively high dielectric constant of silicon (k=11.7) results in significant capacitive loading of RF SOI devices. In another approach, a trap-rich layer is formed between the handle wafer and the BOX in order to minimize parasitic surface conduction effects within the top device layer. However, the trap-rich layer introduces non-linearities, which can result in higher insertion loss and higher signal distortion. In yet another approach, selected portions of the handle wafer under large passive devices in the top device layer are removed. However, removing large portions of the handle wafer reduces mechanical stability. Selective removal also does not uniformly reduce parasitic capacitance, requires precise and unique back-front alignment, and further requires design changes for removal of different portions of the handle wafer for each different top device layer design.

Thus, there is need in the art for efficiently and effectively fabricating SOI devices with reduced parasitic capacitance while overcoming the disadvantages and deficiencies of the previously known approaches.

SUMMARY

The present disclosure is directed to a semiconductor-on-insulator (SOI) device with reduced parasitic capacitance, substantially as shown in and/or described in connection with at least one of the figures, and as set forth in the claims.

DETAILED DESCRIPTION

Figure 1:
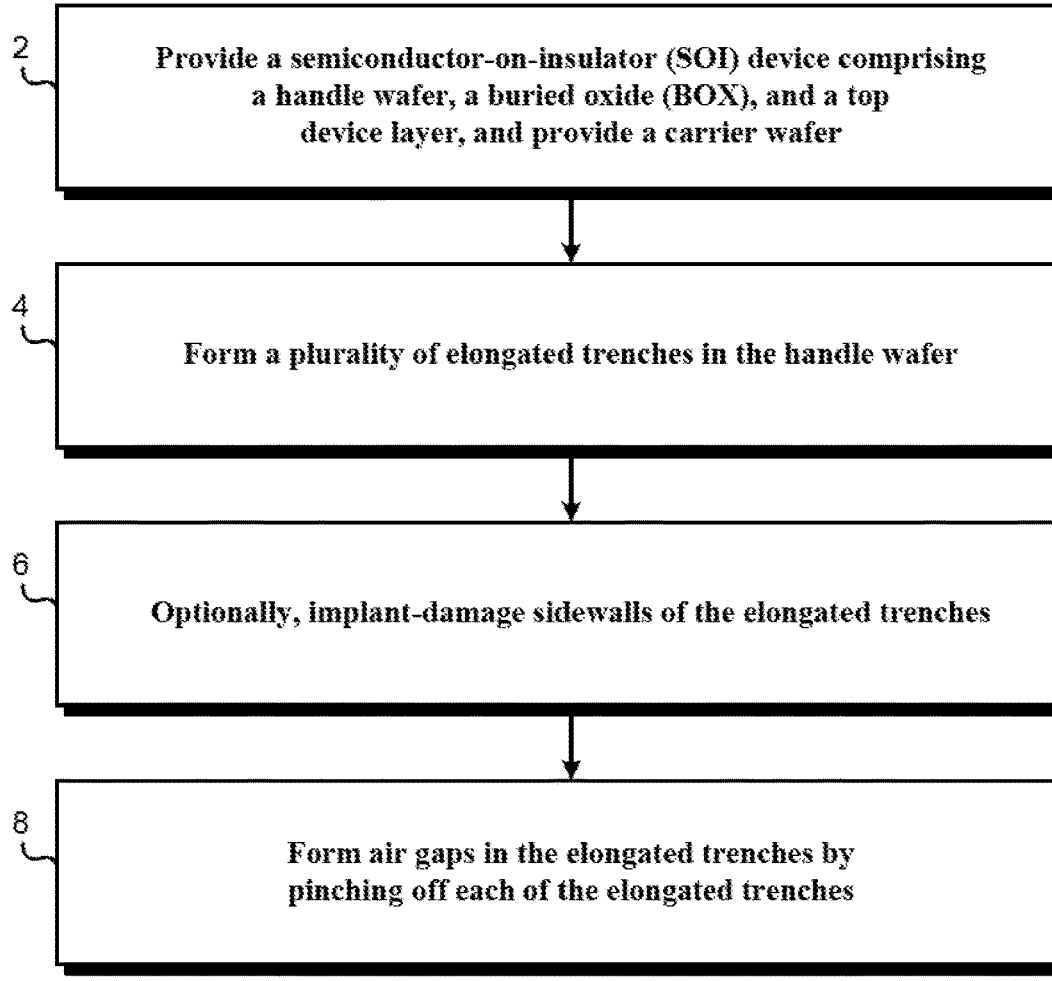
FIG. 1 illustrates a flowchart of an exemplary method for fabricating a semiconductor-on-insulator (SOI) device according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2:
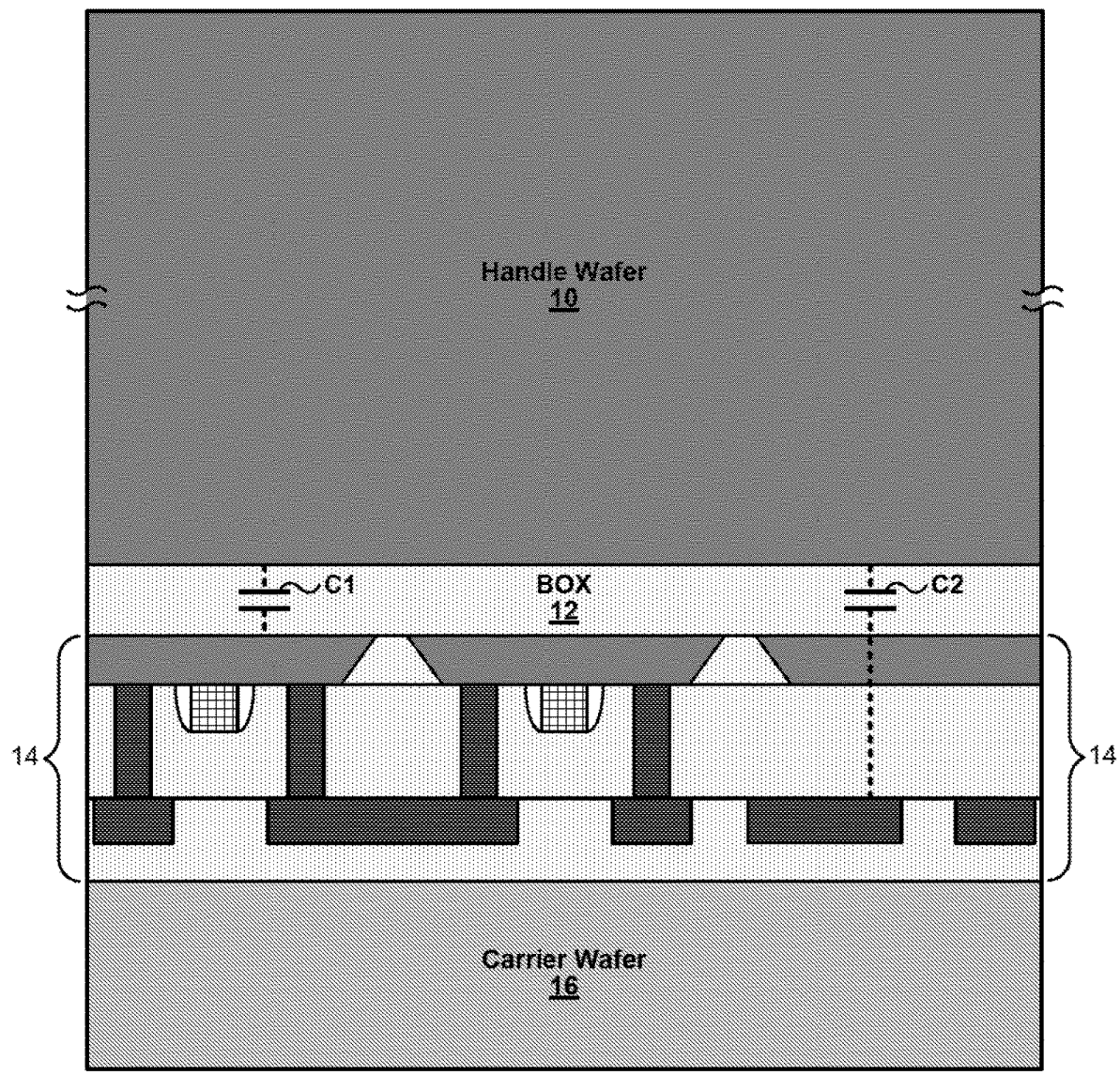
FIG. 2 illustrates an SOI device processed in accordance with action 2 in the flowchart of FIG. 1 according to one implementation of the present application.
Figure 3:
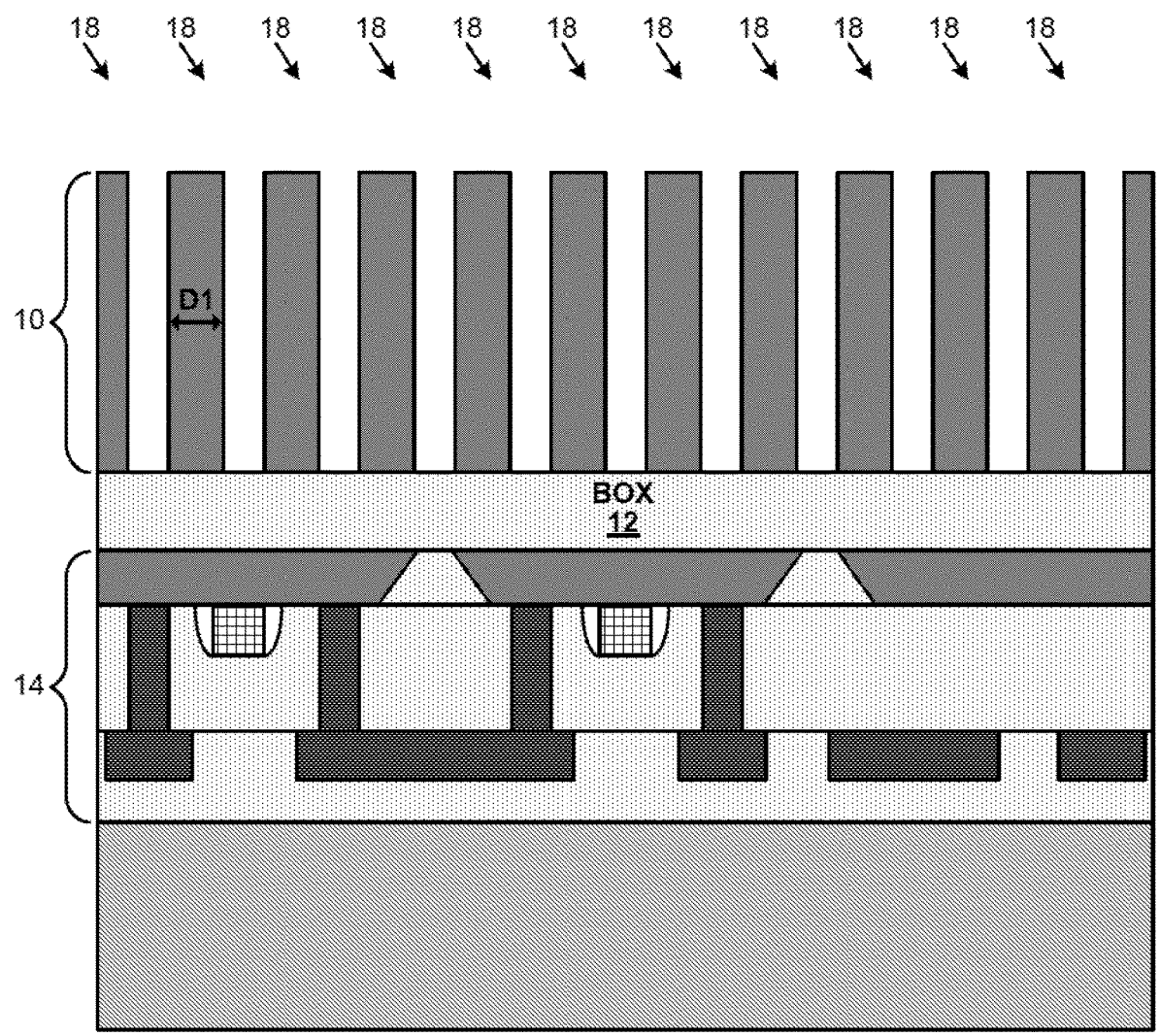
FIG. 3 illustrates an SOI device processed in accordance with action 4 in the flowchart of FIG. 1 according to one implementation of the present application.

FIG. 1 illustrates a flowchart of an exemplary method for fabricating a semiconductor-on-insulator (SOI) device according to one implementation of the present application. Structures shown in FIGS. 2 through 5 illustrate the results of performing actions 2 through 8 shown in the flowchart of FIG. 1. For example, FIG. 2 shows an SOI device after performing action 2 in FIG. 1. FIG. 3 shows an SOI device after performing action 4 in FIG. 1, and so forth.

Actions 2 through 8 shown in the flowchart of FIG. 1 are sufficient to describe one implementation of the present inventive concepts. Other implementations of the present inventive concepts may utilize actions different from those shown in the flowchart of FIG. 1. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 2 illustrates an SOI device processed in accordance with action 2 in the flowchart of FIG. 1 according to one implementation of the present application. As shown in FIG. 2, an SOI device including handle wafer 10, buried oxide (BOX) 12, and top device layer 14 is provided. Carrier wafer 16 is also provided.

Handle wafer 10, BOX 12, and top device layer 14 can be provided together as a pre-fabricated SOI wafer. In various implementations, a bonded and etch back SOI (BESOI) process, a separation by implantation of oxygen (SIMOX) process, or a "smart cut" process can be used for fabricating the SOI wafer as known in the art.

In various implementations, handle wafer 10 can be silicon, high-resistivity silicon, germanium, or group III-V material. BOX 12 is situated on handle wafer 10. BOX 12 can be silicon dioxide or another oxide. Top device layer 14 is situated on BOX 12. Top device layer 14 includes one or more semiconductor devices. For example, top device layer 14 can include active devices, such as field effect transistors (FETs), and passive devices, such as inductors and capacitors. Top device layer 14 can also include one or more layers. For example, top device layer 14 can include a semiconductor layer, and a multi-layer stack of metallizations and interlayer dielectrics.

Devices in top device layer 14 operating at radio frequencies (RF) can be adversely affected by strong parasitic capacitances formed between handle wafer 10 and top device layer 14. For example, when handle wafer 10 is silicon, handle wafer 10 has a relatively high dielectric constant (approximately k=11.7), and parasitic capacitors C1 and C2 are formed between handle wafer 10 and top device layer 14. Disadvantageously, parasitic capacitors C1 and C2 reduce RF signal isolation and increase undesirable noise coupling between various devices in top device layer 14, and also result in higher insertion losses for devices in top device layer 14. Moreover, where top device layer 14 includes a stack of connected switches, parasitic capacitors C1 and C2 can result in voltage being non-uniformly distributed across each switch in the stack. Non-uniform voltage distribution that exceeds a voltage handling capability of a switch can cause the switch to experience failure.

As shown in FIG. 2, the SOI device is temporarily bonded with carrier wafer 16. In particular, top device layer 14 is bonded with carrier wafer 16. In various implementations, carrier wafer 16 can be glass, quartz, or silicon. In one implementation, the SOI device is bonded to the carrier wafer using a curable polymeric adhesive, or using a thermoplastic adhesive as known in the art. The SOI device and carrier wafer 16 are flipped such that carrier wafer 16 is on bottom and handle wafer 10 is on top, to allow subsequent fabricating actions to be performed on handle wafer 10.

FIG. 3 illustrates a semiconductor structure processed in accordance with action 4 in the flowchart of FIG. 1 according to one implementation of the present application. As shown in FIG. 3, a plurality of elongated trenches 18 are formed in handle wafer 10.

Handle wafer 10 can be thinned before elongated trenches 18 are formed. For example, handle wafer 10 can be thinned from an initial thickness of approximately seven hundred twenty-five microns (725 µm) to a thickness of approximately one hundred fifty microns (150 µm). Handle wafer 10 can be thinned by wafer grinding and/or chemical machine polish (CMP) as known in the art.

Next, elongated trenches 18 are formed in handle wafer 10. In one implementation, elongated trenches 18 are formed using a chlorine-based anisotropic etch. As used in the present application, "elongated trenches" refers to trenches that have lengths greater than or equal to their widths. In other words, elongated trenches 18 have aspect ratios greater than or equal to one. In one implementation, a length of each of elongated trenches 18 is approximately one hundred fifty microns (150 µm), while a width of each of elongated trenches 18 is approximately five microns (5 µm). In various implementations, the apertures of elongated trenches (not shown in FIG. 3) can have a circular shape, a rectangular shape, or any other shape.

In the present implementation, elongated trenches 18 extend to the surface of BOX 12. In another implementation, elongated trenches 18 do not extend to the surface of BOX 12, and only extend partially through handle wafer 10. Elongated trenches 18 can be formed using an etch that is selective to BOX 12 and/or using a timed etch that is not selective to BOX 12.

Notably, elongated trenches 18 are approximately uniformly distributed within handle wafer 10. As shown in FIG. 3, each of elongated trenches 18 is approximately separated by distance D1. In one implementation, distance D1 is approximately ten microns (10 µm). Elongated trenches 18 are arranged across the entire width of the SOI device, regardless of the arrangement of devices in top device layer 14.

Figure 4:
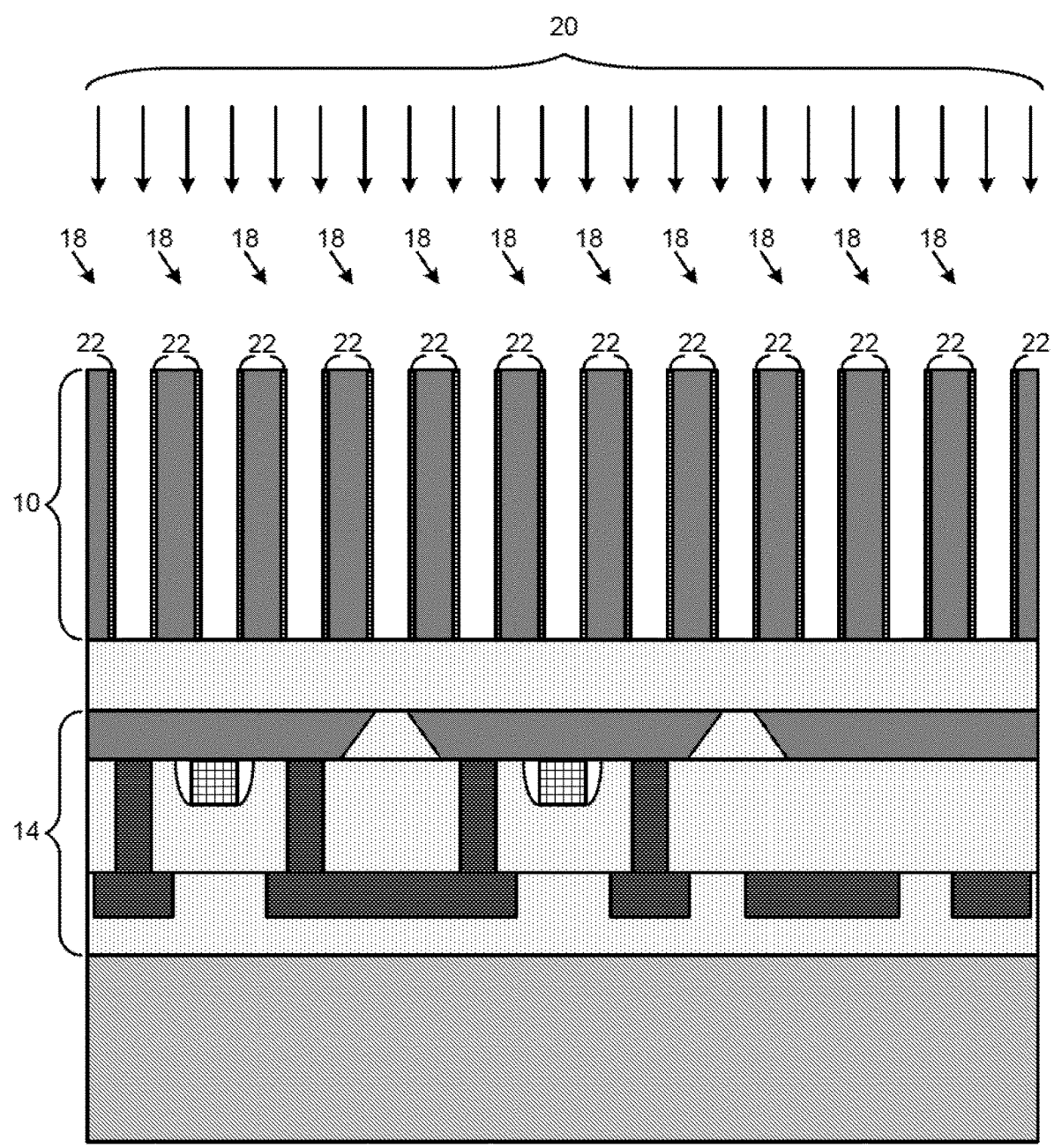
FIG. 4 illustrates an SOI device processed in accordance with action 6 in the flowchart of FIG. 1 according to one implementation of the present application.

FIG. 4 illustrates a semiconductor structure processed in accordance with optional action 6 in the flowchart of FIG. 1 according to one implementation of the present application. As shown in FIG. 4, sidewalls 22 of elongated trenches 18 are implant-damaged as a result of action 6.

Implant 20 is used to implant-damage sidewalls 22 of elongated trenches 18. In various implementations, implant 20 can be argon, silicon, or germanium. In one implementation, the implant energy can be approximately three kiloelectronvolts (3 kev), and the implant dosage can be approximately $10^{15}/cm^2$. As described below, implant-damaged sidewalls 22 prevent formation of a parasitic conduction path in handle wafer 10, reducing parasitic capacitance between handle wafer 10 and top device layer 14. Action 6 is optional since in one implementation of the present application, elongated trenches 18 do not need to be implant-damaged, and action 6 can be skipped.

Figure 5:
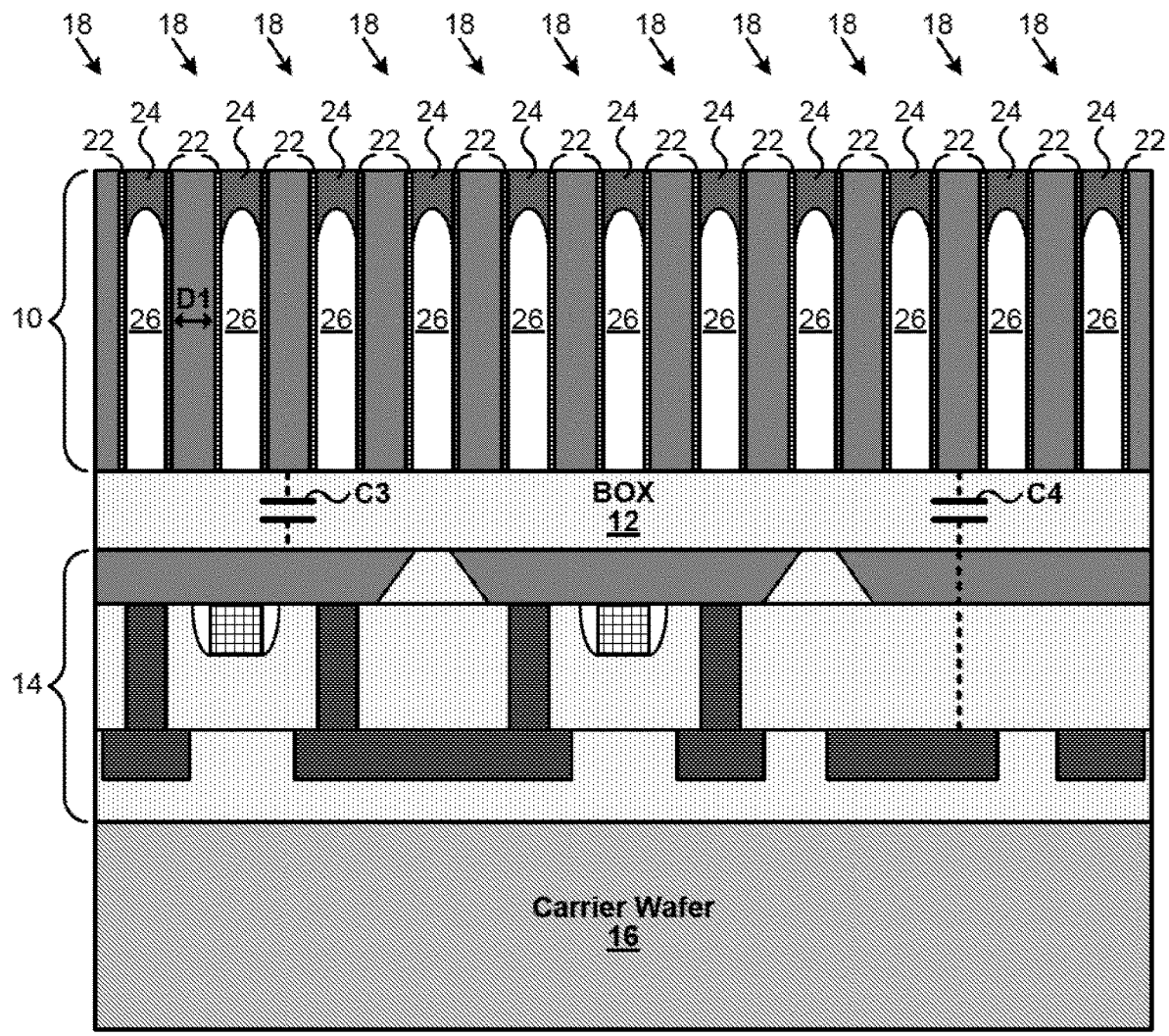
FIG. 5 illustrates an SOI device processed in accordance with action 8 in the flowchart of FIG. 1 according to one implementation of the present application.

FIG. 5 illustrates a semiconductor structure processed in accordance with action 8 in the flowchart of FIG. 1 according to one implementation of the present application. As shown in FIG. 5, air gaps 26 are formed in elongated trenches 18 by pinching off each of the elongated trenches 18.

Air gaps 26 of elongated trenches 18 are situated below pinched-off regions 24 of elongated trenches 18. Air gaps 26 are formed automatically when pinched-off regions 24 are formed using a pinch-off deposition step. Where elongated trenches 18 have an appropriate width, depositing a dielectric using a non-conformal low gap-fill process, such as CVD, causes the dielectric to pinch-off between sidewalls 22 near the tops of elongated trenches 18, thereby resulting in air gaps 26. The deposited dielectric can then be planarized with handle wafer 10, as shown in FIG. 5, by using CMP. As described below, air gaps 26 reduce parasitic capacitance between handle wafer 10 and top device layer 14.

In various implementations, pinched-off regions 24 can comprise tetra-ethyl ortho-silicate (TEOS), undoped silicate glass (USG), or another dielectric. In one implementation, pinched-off regions 24 comprise a low-k dielectric material having a dielectric constant less than conventional silicon dioxide, such as carbon-doped silicon oxide, porous silicon oxide, or porous carbon-doped silicon oxide. Although the present implementation describes forming air gaps 26 by pinching off each of the elongated trenches 18, any method known in the art can be used to form and seal air gaps 26. In various implementations, air gaps 26 can be replaced with a low-k dielectric material other than air. After forming air gaps 26, carrier wafer 16 can be removed, for example, using a laser release, a thermal release, a chemical release, or a mechanical release.

Because elongated trenches 18 include air gaps 26 (or in other implementations a low-k dielectric material other than or in addition to air), elongated trenches 18 reduce parasitic capacitance between handle wafer 10 and top device layer 14. As used in the present application, "low-k dielectric material" refers to material having a dielectric constant significantly less than handle wafer 10. For example, when handle wafer 10 is silicon, a low-k dielectric material can have a dielectric constant significantly less than approximately 11.7. In particular, air gaps 26 comprise air which is a low-k dielectric material having a dielectric constant of approximately 1.0. Pinched-off regions 24 can also comprise low-k dielectric material, for example, having dielectric constant from approximately 2.0 to approximately 5.0.

In the SOI device in FIG. 5, utilizing elongated trenches 18 to introduce low-k dielectric material throughout handle wafer 10 lowers the effective the dielectric constant of handle wafer 10, thereby reducing parasitic capacitance between handle wafer 10 and top device layer 14. In one implementation, the capacitance values of parasitic capacitors C3 and C4 in the SOI device in FIG. 5 are approximately half the capacitance values of parasitic capacitors C1 and C2 respectively in the SOI device in FIG. 2. The SOI device in FIG. 5 can achieve this reduced parasitic capacitance without using costly materials for handle wafer 10, such as quartz or sapphire, and also without requiring any specialized fabrication techniques.

Elongated trenches 18 are also approximately uniformly distributed within handle wafer 10. Elongated trenches 18 can be arranged across the entire expanse of the SOI device, generally uniformly reducing the parasitic capacitances experienced by top device layer 14. Moreover, because there is no need to align a trench with respect to any device in top device layer 14, alignment equipment and alignment techniques are not needed. The SOI device is suited for large scale manufacturing without requiring design changes for removal of different portions of the handle wafer for different top device layer designs. For example, top device layer 14 could be replaced with a new device layer having different devices and arrangements, while the distribution and design of elongated trenches 18 in handle wafer 10 do not need to be modified to accommodate the different device layer design.

Pinched-off regions 24 also provide mechanical stability for the SOI device. For example, molding and/or packaging actions can be accommodated by handle wafer 10 and pinched-off regions 24 of elongated trenches 18. Handle wafer 10 would be weaker and less mechanically stable if pinched-off regions 24 were not used and air gaps 26 were exposed at the tops of elongated trenches 18. While pinched-off regions 24 generally have a slightly higher dielectric constant compared to air gaps 26, pinched-off regions 24 are situated further from devices in top device layer 14, such that air gaps 26 still significantly reduce parasitic capacitance between handle wafer 10 and top device layer 14. Distance D1 can also be adjusted to optimize a tradeoff between mechanical stability of the SOI device and reduction in parasitic capacitance provided by air gaps 26.

Implant-damaged sidewalls 22 also prevent formation of a parasitic conduction path in handle wafer 10, further reducing parasitic capacitance between handle wafer 10 and top device layer 14. If sidewalls 22 of elongated trenches 18 were not implant-damaged, fixed charges could invert the surface of sidewalls 22, especially when handle wafer 10 comprises high resistivity silicon, and would create a parasitic conduction path. By implant-damaging sidewalls 22 of elongated trenches 18, parasitic capacitance between handle wafer 10 and top device layer 14 is further reduced.

Figure 6:
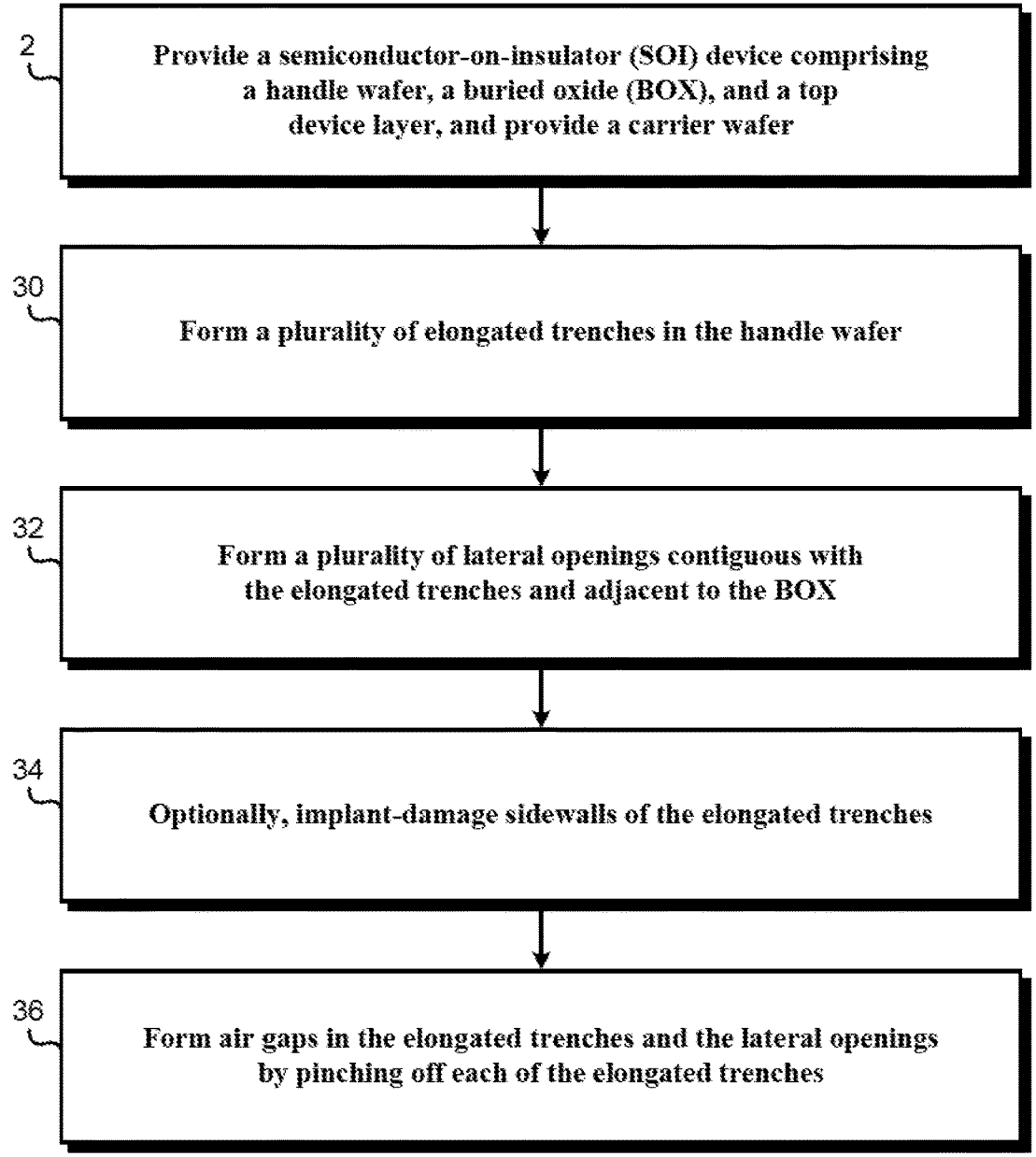
FIG. 6 illustrates a flowchart of an exemplary method for fabricating an SOI device according to one implementation of the present application.
Figure 7:
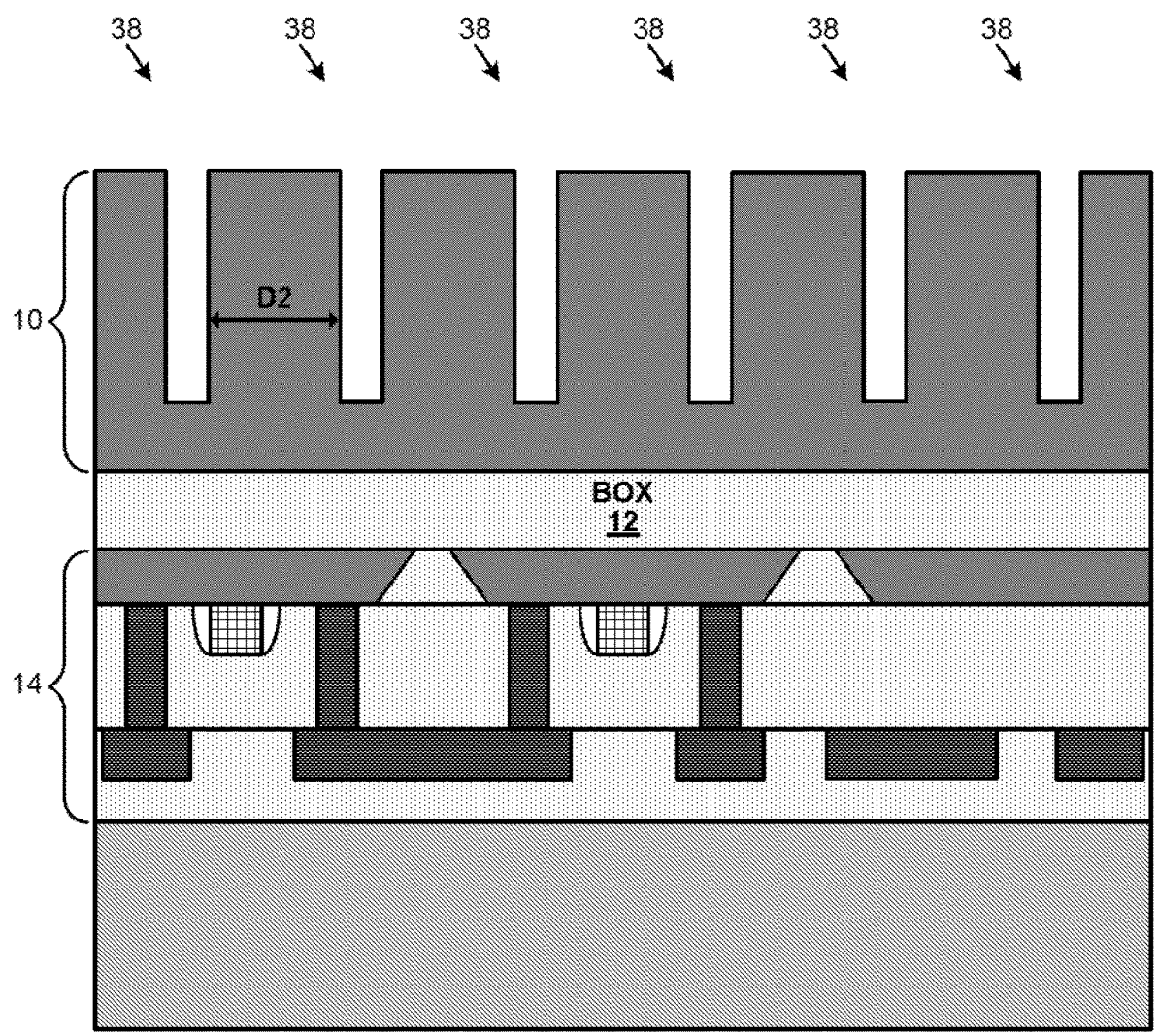
FIG. 7 illustrates an SOI device processed in accordance with action 30 in the flowchart of FIG. 6 according to one implementation of the present application.
Figure 8:
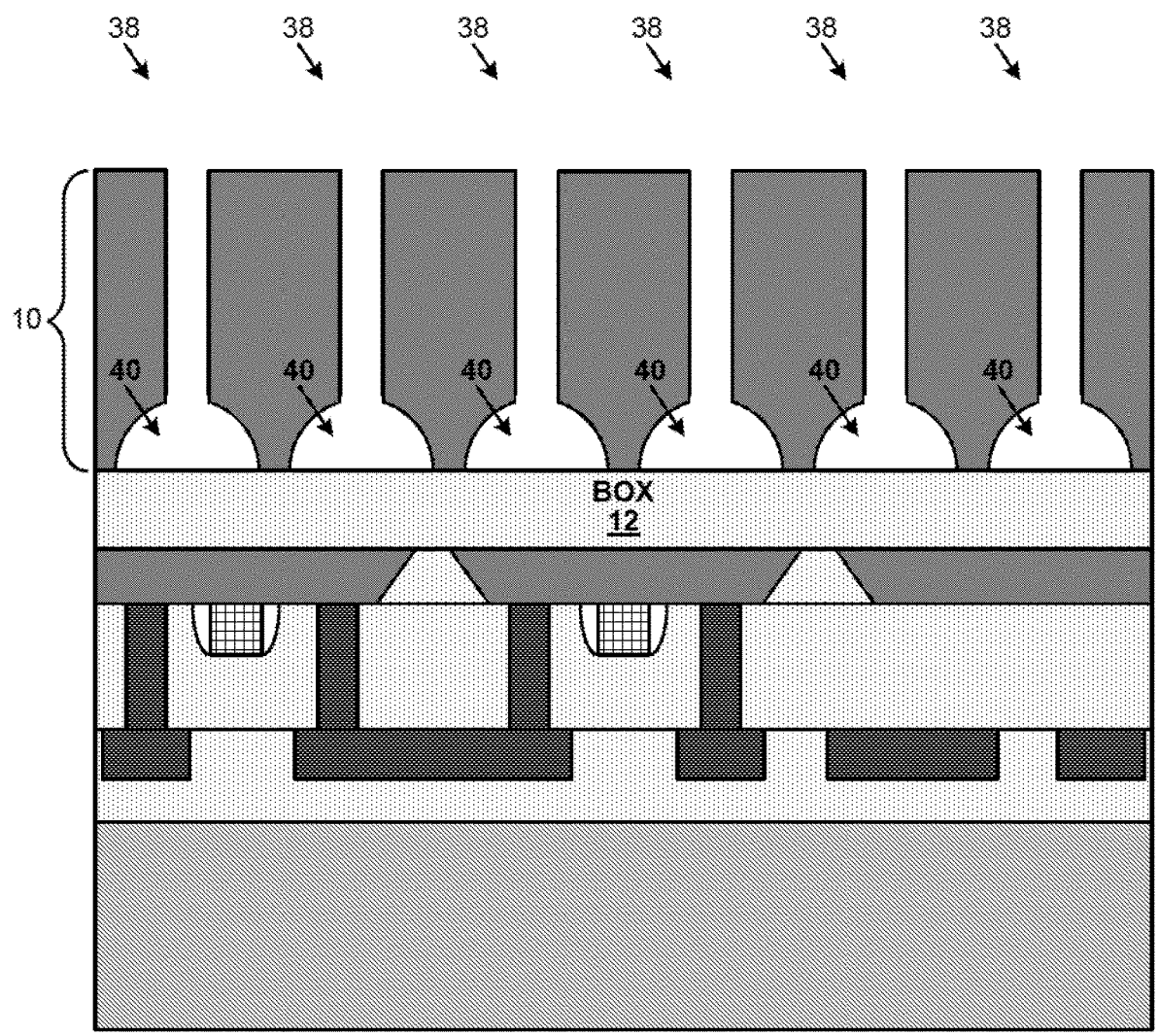
FIG. 8 illustrates an SOI device processed in accordance with action 32 in the flowchart of FIG. 6 according to one implementation of the present application.

FIG. 6 illustrates a flowchart of an exemplary method for fabricating an SOI device according to one implementation of the present application. The flowchart in FIG. 6 begins with action 2 with providing an SOI device and a carrier wafer. The SOI device and carrier wafer can be provided as shown in FIG. 2 and as described above. Structures shown in FIGS. 7 through 10 illustrate the results of performing actions 30 through 36 shown in the flowchart of FIG. 6. For example, FIG. 7 shows an SOI device after performing action 30 in FIG. 6, FIG. 8 shows an SOI device after performing action 32 in FIG. 6, and so forth.

Actions 30 through 36 shown in the flowchart of FIG. 6 are sufficient to describe one implementation of the present inventive concepts. Other implementations of the present inventive concepts may utilize actions different from those shown in the flowchart of FIG. 6. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 7 illustrates a semiconductor structure processed in accordance with action 30 in the flowchart of FIG. 6 according to one implementation of the present application. As shown in FIG. 7, a plurality of elongated trenches 38 are formed in handle wafer 10.

Handle wafer 10 can be thinned before elongated trenches 38 are formed, as described above. Next, elongated trenches 38 are formed in handle wafer 10. Unlike elongated trenches 18 in FIG. 3, elongated trenches 38 in FIG. 7 do not extend to the surface of BOX 12, and only extend partially through handle wafer 10. Elongated trenches 38 can be formed using a timed etch. In one implementation, elongated trenches 38 are formed using a chlorine-based anisotropic etch. In one implementation, elongated trenches 38 are formed using the Bosch etch process known in the art, which leaves a residual polymer (not shown in FIG. 7) on the sidewalls of elongated trenches 38. In one implementation, a length of each of elongated trenches 38 is approximately one hundred thirty microns (130 μm), while a width of each of elongated trenches 38 is approximately five microns (5 μm). In various implementations, the apertures of elongated trenches (not shown in FIG. 7) can have a circular shape, a rectangular shape, or any other shape.

Notably, elongated trenches 38 are approximately uniformly distributed within handle wafer 10. As shown in FIG. 7, each of elongated trenches 38 is approximately separated by distance D2. In one implementation, distance D2 is approximately thirty microns (30 μm). Elongated trenches 38 are arranged across the entire width of the SOI device, regardless of the arrangement of devices in top device layer 14.

FIG. 8 illustrates a semiconductor structure processed in accordance with action 32 in the flowchart of FIG. 6 according to one implementation of the present application. As shown in FIG. 8, a plurality of lateral openings 40 are formed contiguous with elongated trenches 38 and adjacent to BOX 12. Lateral openings 40 are situated in handle wafer 10. In one implementation, lateral openings 40 are formed using a fluorine-based isotropic etch. The sidewalls of elongated trenches 38 can be protected from the etch, for example, by a residual polymer left during formation of elongated trenches 38. Lateral openings 40 can thus be formed at the bottoms of elongated trenches 38 in handle wafer 10, such that lateral openings 40 are contiguous with elongated trenches 38 and adjacent to BOX 12.

As used in the present application, "lateral openings" refers to openings that have widths greater than the widths of elongated trenches 38. In one implementation, a width of each of elongated trenches 38 is approximately five microns (5 μm), while a width of each of lateral openings 40 is approximately twenty microns (20 μm). In the present implementation, lateral openings 40 extend to the surface of BOX 12. In another implementation, lateral openings 40 do not extend to the surface of BOX 12, and only extend partially through handle wafer 10. Lateral openings 40 can be formed using an etch that is selective to BOX 12 and/or using a timed etch that is not selective to BOX 12.

Figure 9:
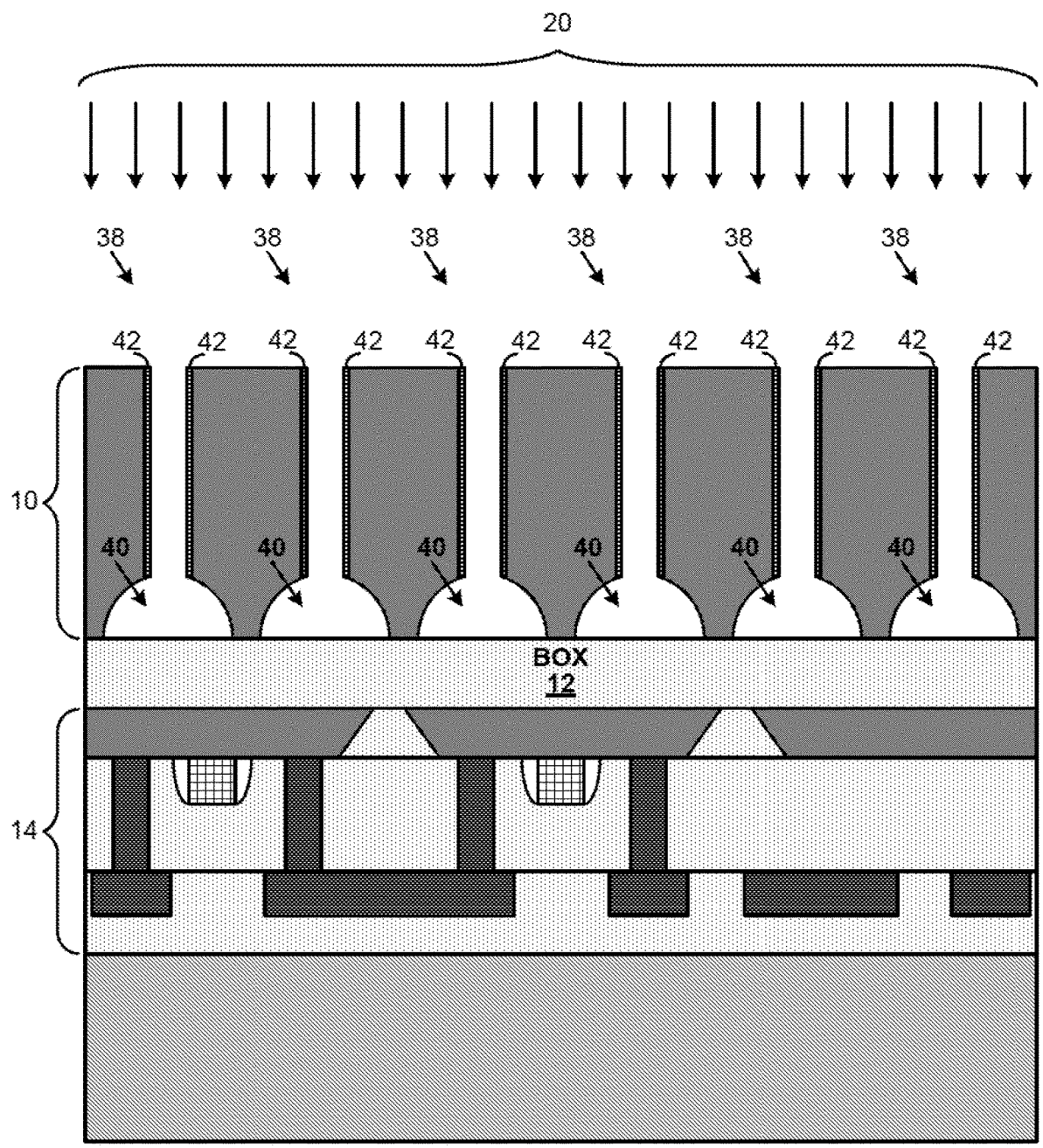
FIG. 9 illustrates an SOI device processed in accordance with action 34 in the flowchart of FIG. 6 according to one implementation of the present application.

FIG. 9 illustrates a semiconductor structure processed in accordance with optional action 34 in the flowchart of FIG. 6 according to one implementation of the present application. As shown in FIG. 9, sidewalls 42 of elongated trenches 38 are implant-damaged as a result of action 34.

Implant 20 is used to implant-damage sidewalls 42 of elongated trenches 38. Implant 20 in FIG. 9 is similar to implant 20 in FIG. 4, and may have any implementations and advantages described above. Implant-damaged sidewalls 42 in FIG. 9 are similar to implant-damaged sidewalls 22 in FIG. 4, except that implant-damaged sidewalls 42 in FIG. 9 are shorter, because elongated trenches 38 in FIG. 9 do not extend to a surface of BOX 12, being foreshortened by lateral openings 40. As described above, implant-damaged sidewalls 42 prevent formation of a parasitic conduction path in handle wafer 10, reducing parasitic capacitance between handle wafer 10 and top device layer 14. Action 34 is optional since in one implementation of the present application, elongated trenches 38 do not need to be implant-damaged, and action 34 can be skipped.

Figure 10:
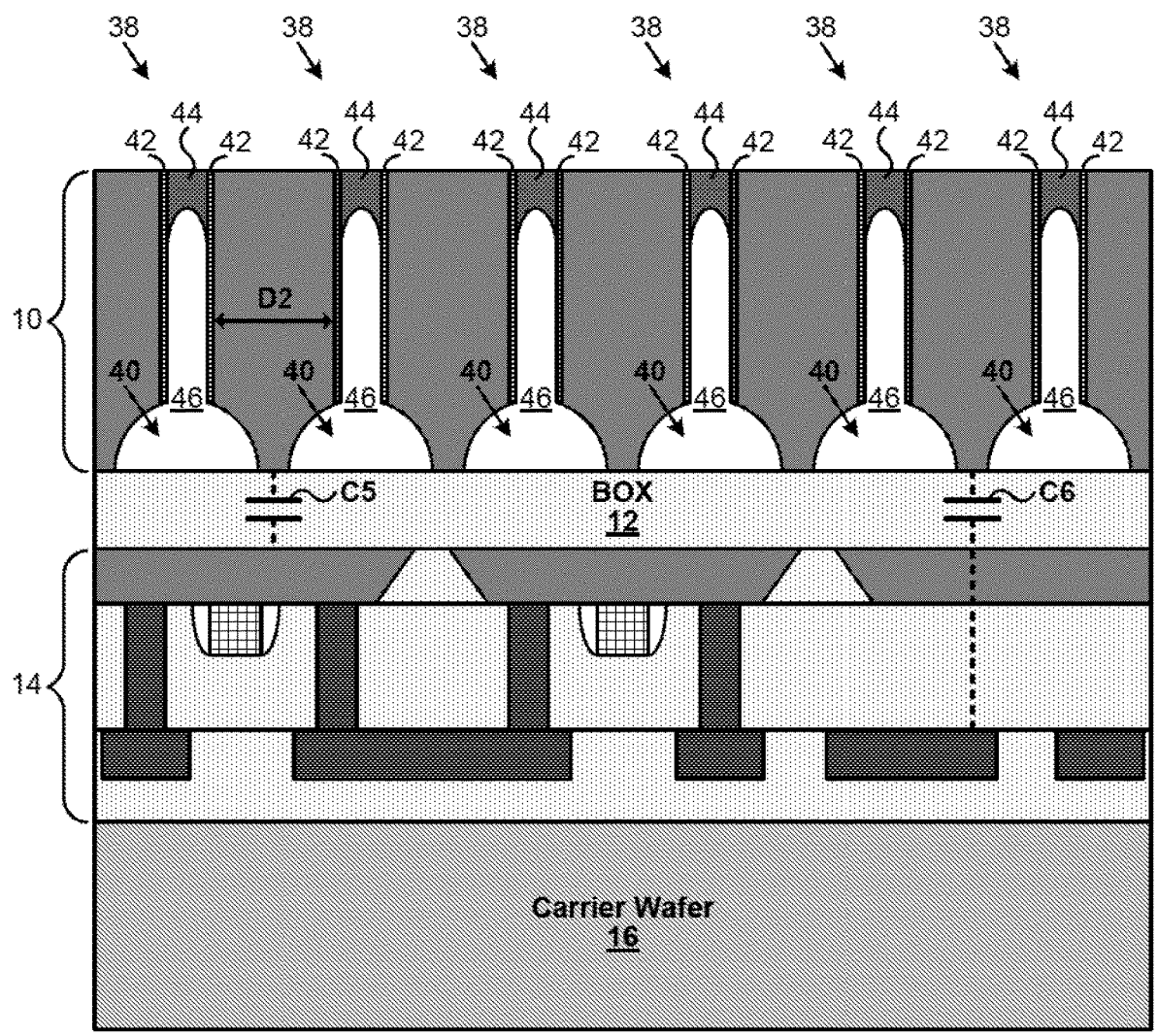
FIG. 10 illustrates an SOI device processed in accordance with action 36 in the flowchart of FIG. 6 according to one implementation of the present application.

FIG. 10 illustrates a semiconductor structure processed in accordance with action 36 in the flowchart of FIG. 6 according to one implementation of the present application. As shown in FIG. 10, air gaps 46 are formed in elongated trenches 38 and lateral openings 40 by pinching off each of the elongated trenches 38.

Air gaps 46 of elongated trenches 38 are situated below pinched-off regions 44 of elongated trenches 38. Air gaps 46 are formed automatically when pinched-off regions 44 are formed using a pinch-off deposition step. Pinched-off regions 44 in FIG. 10 can be formed similarly to pinched-off regions 24 in FIG. 5, and may have any implementations and advantages described above. As described above, air gaps 46 reduce parasitic capacitance between handle wafer 10 and top device layer 14. After forming air gaps 46, carrier wafer 16 can be removed, for example, using a laser release, a thermal release, a chemical release, or a mechanical release.

Because elongated trenches 38 and lateral openings 40 include air gaps 46 (or in other implementations a low-k dielectric material other than or in addition to air), elongated trenches 38 and lateral openings 40 reduce parasitic capacitance between handle wafer 10 and top device layer 14. In particular, lateral openings 40 are wider than elongated trenches 38 and adjacent to BOX 12. Thus, a greater volume in handle wafer 10 comprises a low-k dielectric material, which is also near the surface of BOX 12. In the present implementation, due to the increased volume of low dielectric constant material provided by lateral openings 40, and due to proximity of this increased volume of low dielectric constant material with the surface of BOX 12, lateral openings 40 in conjunction with elongation trenches 38 further reduce parasitic capacitance when compared with using elongated trenches 38 alone.

Because lateral openings 40 are contiguous with elongation trenches 38, fewer elongated trenches 38 are needed in the SOI device in FIG. 10 in order to achieve the same reduced parasitic capacitances as the SOI device in FIG. 5. In one implementation, the capacitance values of parasitic capacitors C5 and C6 in the SOI device in FIG. 10 are approximately equal to the capacitance values of parasitic capacitors C3 and C4 respectively in the SOI device in FIG. 5. Depending on the dimensions of lateral openings 40, in one implementation, the capacitance values of parasitic capacitors C5 and C6 in the SOI device in FIG. 10 are even less than the capacitance values of parasitic capacitors C3 and C4 respectively in the SOI device in FIG. 5.

Because fewer elongated trenches 38 are needed in the SOI device in FIG. 10, fewer pinched-off regions 44 are also needed. Distance D2 in FIG. 10 is greater than distance D1 in FIG. 5. Thus, better mechanical stability is provided and molding and/or packaging actions can be better accommodated by handle wafer 10 in the present implementation.

Elongated trenches 38 are also approximately uniformly distributed, generally uniformly reducing the parasitic capacitances experienced by top device layer 14, eliminating need to align a trench with respect to any device in top device layer 14. Implant-damaged sidewalls 42 can also prevent formation of a parasitic conduction path in handle wafer 10, further reducing parasitic capacitance between handle wafer 10 and top device layer 14.

Thus, various implementations of the present application achieve an SOI device having elongated trenches with air gaps and/or other low-k dielectric materials and pinched-off regions to overcome the deficiencies in the art and result in low parasitic capacitances using effective and practical large scale fabrication. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. An SOI (semiconductor-on-insulator) device comprising:
    a handle wafer;
    a buried oxide (BOX);
    a top device layer;
    said handle wafer having a plurality of elongated trenches;
    each of said plurality of elongated trenches comprising a low-k dielectric material and a pinched-off region, said plurality of elongated trenches reducing parasitic capacitance between said handle wafer and said top device layer.

2. The SOI device of claim 1, wherein sidewalls of said elongated trenches are implant-damaged so as to further reduce said parasitic capacitance between said handle wafer and said top device layer.

3. The SOI device of claim 1, wherein said low-k dielectric material comprises air in air gaps.

4. The SOI device of claim 1, wherein said elongated trenches are approximately uniformly distributed within said handle wafer.

5. The SOI device of claim 1, wherein said elongated trenches extend to a surface of said BOX.

6. The SOI device of claim 1, wherein said elongated trenches do not extend to a surface of said BOX.

7. An SOI (semiconductor-on-insulator) device comprising:
    a handle wafer;
    a buried oxide (BOX);
    a top device layer;
    said handle wafer having a plurality of elongated trenches contiguous with a plurality of lateral openings, said lateral openings adjacent to said BOX;
    each of said elongated trenches comprising a low-k dielectric material and a pinched-off region;
    each of said lateral openings comprising said low-k dielectric material;

said elongated trenches and said lateral openings reducing parasitic capacitance between said handle wafer and said top device layer.

8. The SOI device of claim 7, wherein sidewalls of said elongated trenches are implant-damaged so as to further reduce said parasitic capacitance between said handle wafer and said top device layer.

9. The SOI device of claim 7, wherein said low-k dielectric material comprises air in air gaps.

10. The SOI device of claim 7, wherein said elongated trenches are approximately uniformly distributed within said handle wafer.

11. The SOI device of claim 7, wherein a width of at least one of said lateral openings is at least two times a width of at least one of said elongated trenches.

12. The SOI device of claim 7, wherein said lateral openings extend to a surface of said BOX.

13. An SOI (semiconductor-on-insulator) device comprising:
   a handle wafer;
   a buried oxide (BOX);
   a top device layer;
   said handle wafer having a plurality of trenches extending from a back surface of said handle wafer opposite said BOX, said trenches comprising a low-k dielectric material, said low-k dielectric material being in contact with said BOX, said plurality of trenches reducing parasitic capacitance between said handle wafer and said top device layer.

14. The SOI device of claim 13, wherein sidewalls of said trenches are implant-damaged so as to further reduce said parasitic capacitance between said handle wafer and said top device layer.

15. The SOI device of claim 13, wherein said low-k dielectric material comprises air.

16. An SOI (semiconductor-on-insulator) device comprising:
   a handle wafer;
   a buried oxide (BOX);
   a top device layer;
   said handle wafer having a plurality of trenches contiguous with a plurality of lateral openings;
   each of said lateral openings comprising said low-k dielectric material in contact with said BOX;
   said trenches and said lateral openings reducing parasitic capacitance between said handle wafer and said top device layer.

17. The SOI device of claim 16, wherein sidewalls of said trenches are implant-damaged so as to further reduce said parasitic capacitance between said handle wafer and said top device layer.

18. The SOI device of claim 16, wherein said low-k dielectric material comprises air.

* * * * *